(12) United States Patent
Smith

(10) Patent No.: US 12,298,330 B1
(45) Date of Patent: May 13, 2025

(54) PEAK DETECTOR CIRCUIT AND AN ELECTRONICS SYSTEM THAT INCLUDES THE PEAK DETECTOR CIRCUIT

(71) Applicant: Cypress Semiconductor Corporation, San Jose, CA (US)

(72) Inventor: Nicholaus Smith, San Diego, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 19 days.

(21) Appl. No.: 18/501,668

(22) Filed: Nov. 3, 2023

(51) Int. Cl.
*G01R 19/04* (2006.01)
*H02J 50/10* (2016.01)

(52) U.S. Cl.
CPC .............. *G01R 19/04* (2013.01); *H02J 50/10* (2016.02)

(58) Field of Classification Search
CPC ................................. G01R 19/04; H02J 50/10
USPC .......................................................... 307/104
See application file for complete search history.

(56) References Cited

U.S. PATENT DOCUMENTS

| | | | | |
|---|---|---|---|---|
| 10,073,123 | B1* | 9/2018 | Miao | G01R 33/1207 |
| 2015/0108849 | A1* | 4/2015 | Robertson | H02J 50/12 |
| | | | | 307/104 |
| 2017/0126072 | A1* | 5/2017 | Tsai | H02M 3/33573 |
| 2020/0007115 | A1* | 1/2020 | Franke | H03K 5/1532 |
| 2020/0119706 | A1* | 4/2020 | Curtis | H03F 3/45713 |
| 2020/0326358 | A1* | 10/2020 | Dina | H03K 5/1532 |
| 2021/0405125 | A1* | 12/2021 | Zimek | G01S 7/497 |
| 2022/0299546 | A1* | 9/2022 | Chen | G01R 19/04 |
| 2022/0416737 | A1* | 12/2022 | Goldblatt | H03F 3/191 |

OTHER PUBLICATIONS

"Wireless charging IC (WLC)—Transmitter 15W with integrated USB Type-C PD controller", WLC1115, Datasheet, Apr. 22, 2022, pp. 1-40.

* cited by examiner

*Primary Examiner* — Alfonso Perez Borroto
(74) *Attorney, Agent, or Firm* — Murphy, Bilak & Homiller, PLLC

(57) ABSTRACT

A peak detector circuit includes: a single operational amplifier having a non-inverting input, an inverting input, and an output; an output capacitor; a first diode having an anode electrically coupled to the output of the single operational amplifier and a cathode electrically coupled to the output capacitor; an RC feedback network electrically coupled between the output capacitor and the inverting input of the single operational amplifier; and a second diode having an anode electrically coupled to the inverting input of the single operational amplifier and a cathode electrically coupled to the anode of the first diode. An electronics system that includes the peak detector circuit is also described.

22 Claims, 4 Drawing Sheets

PEAK DETECTOR CIRCUIT AND AN ELECTRONICS SYSTEM THAT INCLUDES THE PEAK DETECTOR CIRCUIT

BACKGROUND

Peak voltage detection is required in many types of electronics applications, such as wireless power transfer, power supplies, etc. The ideal peak voltage detection circuit should be simple, reliable, and low cost. However, low complexity designs for peak voltage detection tend to be plagued by large errors. More complex solutions are costly, have slow settling time, and may still suffer from inaccuracy.

Thus, there is a need for an improved peak voltage detector circuit.

SUMMARY

According to an embodiment of a peak detector circuit, the peak detector circuit comprises: a single operational amplifier having a non-inverting input, an inverting input, and an output; an output capacitor; a first diode having an anode electrically coupled to the output of the single operational amplifier and a cathode electrically coupled to the output capacitor; an RC feedback network electrically coupled between the output capacitor and the inverting input of the single operational amplifier; and a second diode having an anode electrically coupled to the inverting input of the single operational amplifier and a cathode electrically coupled to the anode of the first diode.

According to an embodiment of an electronics system, the electronics system comprises: a controller; and a peak detector circuit. The peak detector circuit comprises: a single operational amplifier having a non-inverting input, an inverting input, and an output; an output capacitor; a first diode having an anode electrically coupled to the output of the single operational amplifier and a cathode electrically coupled to the output capacitor; an RC feedback network electrically coupled between the output capacitor and the inverting input of the single operational amplifier; and a second diode having an anode electrically coupled to the inverting input of the single operational amplifier and a cathode electrically coupled to the anode of the first diode, wherein the controller comprises an analog-to-digital converter configured to digitize a voltage at the output capacitor of the peak detector circuit, wherein the controller is configured to control one or more electronic components of the electronics system based on the voltage digitized by the analog-to-digital converter.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a peak detector circuit having a simple, reliable, and low cost design. The peak detector circuit includes a single operational amplifier, first and second diodes, an output capacitor, and an RC feedback network electrically coupled between the output capacitor and the inverting input of the single operational amplifier. The anode of the first diode is electrically coupled to the output of the single operational amplifier and the cathode of the first diode is electrically coupled to the output capacitor. The anode of the second diode is electrically coupled to the inverting input of the single operational amplifier and the cathode of the second diode is electrically coupled to the anode of the first diode.

The diode and RC feedback network configurations ensure the peak detector circuit is fast, accurate, and settles quickly. For example, the peak detector circuit can accurately track the incoming AC voltage over a target frequency range, e.g., from 100 kHz to 400 kHz in the case of a transmit coil voltage for a wireless power transfer system. The peak detector circuit can respond to voltage changes in less than 1 ms. The peak detector circuit can compensate for errors caused by temperature changes.

Described next, with reference to the figures, are exemplary embodiments of the peak detector circuit and electronics systems that includes the peak detector circuit.

Figure 1:
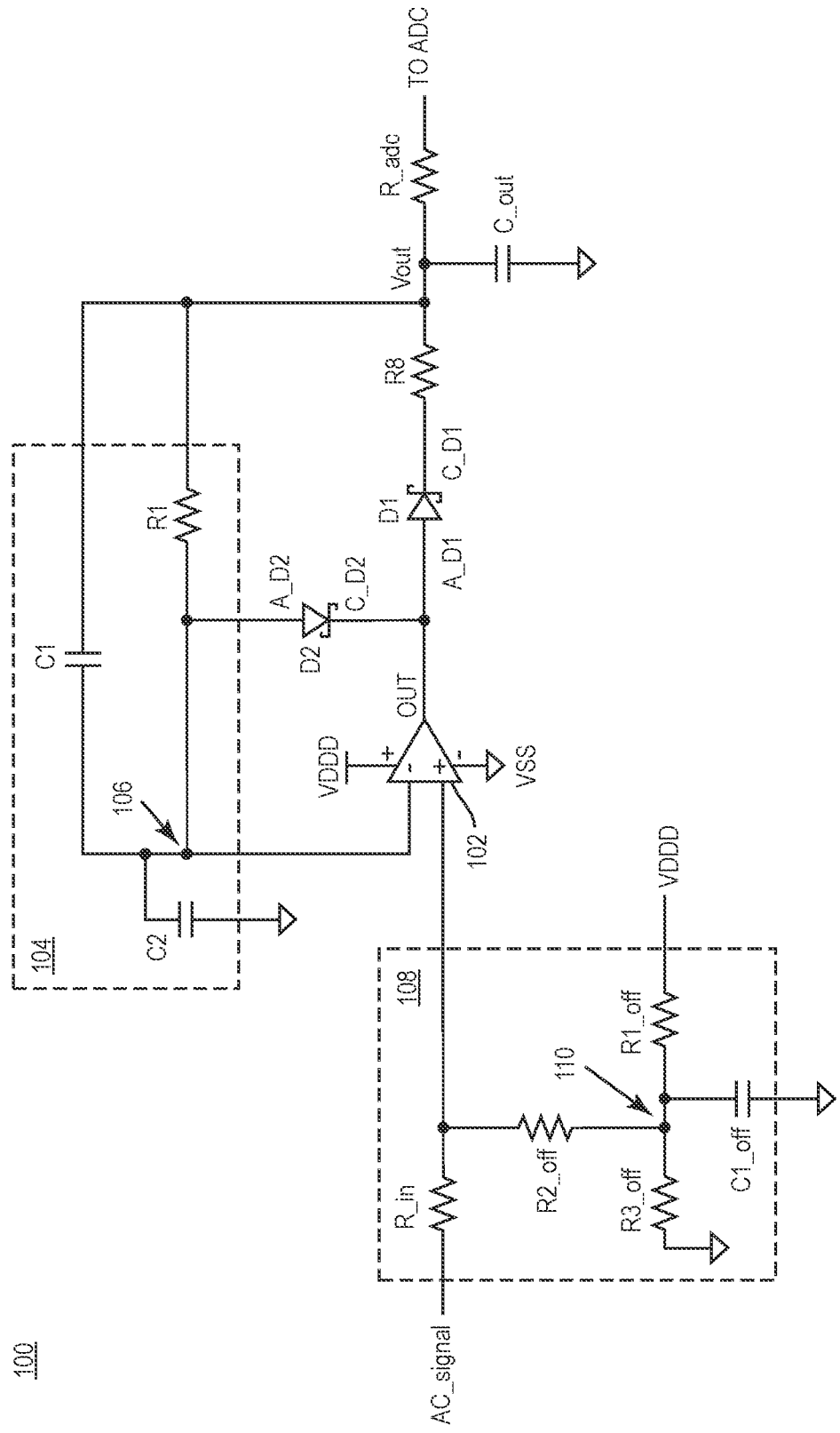
FIG. 1 illustrates a circuit schematic of a peak detector circuit, according to an embodiment.

FIG. 1 illustrates a circuit schematic of a peak detector circuit 100, according to an embodiment. The peak detector circuit 100 includes a single operational amplifier (op-amp) 100 having a non-inverting input '+', an inverting input '−', and an output 'OUT'. The single op-amp 100 may be a rail-to-rail op-amp. For example, a low gain bandwidth product (GBP) device can be used as the single op-amp 100.

The peak detector circuit 100 also includes an output capacitor C_out, a first diode D1, a second diode D2, and an RC feedback network 104. The anode A_D1 of the first diode D1 is electrically coupled to the output OUT of the single op-amp 102 and the cathode C_D1 of the first diode D1 is electrically coupled to the output capacitor C_out, e.g., through a resistor R8. The anode A_D2 of the second diode D2 is electrically coupled to the inverting input '−' of the single op-amp 102 and the cathode C_D2 of the second diode D2 is electrically coupled to the anode A_D1 of the first diode D1 (and thus to the output OUT of the single op-amp 102). The RC feedback network 104 is electrically coupled between the output capacitor C_out and the inverting input '−' of the single op-amp 102. The AC signal input ('AC_signal') to the peak detector circuit 100 is applied to the non-inverting input '+' of the single op-amp 102.

The single op-amp 102 compensates for the forward voltage drop across the first diode D1. The feedback and gain of the RC feedback network 104 are selected such that the RC feedback network 104 quickly tracks the non-inverting input '+' of the single op-amp 102 and captures the peak pulses at the output OUT of the single op-amp 102 when a voltage 'Vout' at the output capacitor C_out is less than a voltage at the inverting input '−' of the single op-amp 102, where the output capacitor C_out stores the peak voltage for reading, e.g., by an ADC (analog-to-digital converter). The second diode D2 discharges the output capacitor C_out and improves the behavior of the first diode D1 so that the first diode D1 more closely approximates an ideal diode. That is, the second diode D2 accelerates forward biasing of the first diode D1 via the RC feedback network 104 when the second diode D2 is in forward conduction.

More particularly, the second diode D2 rectifies the signal at the anode A_D2 of the second diode D2 and provides a discharge path for the output capacitor C_out when the second diode D2 is in forward conduction. The RC feedback network 104 compensates for the voltage drop across the first diode D1. The first diode D1 rectifies the signal at the anode A_D1 of the first diode D1 and the RC feedback network 104 compensates for the voltage drop of the first diode D1, enabling the peak detector circuit 100 to provide fast response and accurate peak tracking. In one embodiment, a transfer function representing the RC feedback network 104 has a zero located about 10 times away (or more) from the fastest operating frequency of the peak detector circuit 100 which may be, e.g., 360 kHz. The peak detector circuit 100 is tuneable for different frequencies, depending on the type of op-amp 102 and the RC values used for the gain and feedback of the RC feedback network 104.

In one embodiment, the RC feedback network 104 of the peak detector circuit 100 includes a first capacitor C1, a second capacitor C2, and a first resistor R1. The first capacitor C1 is electrically coupled between the inverting input '−' of the single op-amp 102 and the output capacitor C_out. The second capacitor C2 is electrically coupled between the inverting input '−' of the single op-amp 102 and ground. The first resistor R1 is in parallel with the first capacitor C1. The anode A_D2 of the second diode D2 is electrically coupled to a node 106 common to the first resistor R1, the first capacitor C1, and the second capacitor C2. In one embodiment, the capacitance ratio (C1/C2) of the first and second capacitors C1, C2 is in a range of 0.9 to 1.1. For example, in the case of a wireless power transfer application, the capacitance ratio (C1/C2) of the first and second capacitors C1, C2 may be about 1. For systems under 20 MHZ, C1 and C2 may be under 100 pF.

The first resistor R1, the first capacitor C1, and the second capacitor C2 form a negative feedback loop that controls/sets the gain and response time of the single op-amp 102. The bandwidth of the RC feedback network 104 is much higher/faster than the single op-amp 102, enabling fast peak detection and short settling time. More particularly, the second diode D2 and the capacitors C1, C2 of the RC feedback network 104 enable an AC path to exist which allows the peak detector circuit 100 to react quickly. The effective zero of the RC feedback network 104 should be far away from the fastest operating frequency (e.g., 360 kHz) of the peak detector circuit 100, e.g., about 10 times further from the fastest operating frequency. The bandwidth of the RC feedback network 104 is adjustable by changing the ratio of C1/C2.

The second diode D2 allows the feedback path to feed directly back into the output OUT of the single op-amp 102, which provides extra energy for representing the node voltage at the output capacitor C_out more accurately. The first diode D1 enters forward conduction at the peak of the AC input signal. By introducing the AC feedback path via the RC feedback network 104, the loop speeds up dramatically and moves the peak detection point as close as possible to the true peak. The second diode D2 provides more push to forward bias the first diode D1, further improving the response time of the peak detector circuit 100. The AC feedback path provided by the RC feedback network 104 plus the second diode D2 also has a low component count.

The peak detector circuit 100 can handle a wide range of high input voltages that need peak detection, which is also tuneable. To this end, the peak detector circuit 100 may include a DC voltage offset network 108 electrically coupled to the non-inverting input '+' of the single op-amp 102. The DC voltage offset network 108 applies a DC voltage offset to the non-inverting input '+' of the single op-amp 102. The single op-amp 102 exhibits non-linear behavior when the AC input signal applied to the non-inverting input '+' of the op-amp 102 is <0V relative to the Vss (reference) pin of the op-amp 102. In one embodiment, the DC voltage offset is selected such that the AC signal applied to the non-inverting input '+' of the single op-amp 102 has a peak-to-peak voltage of at least 50V before the non-inverting op-amp input '+' drops below 0V. This is just an example, however.

More generally, the DC voltage offset provided by the DC voltage offset network 108 may be selected such that the AC signal applied to the non-inverting input '+' of the single op-amp 102 has any desired peak-to-peak voltage before the non-inverting op-amp input '+' drops below 0V. The DC voltage offset is based on the magnitude of the AC signal input to the peak detector circuit 102, and prevents the non-inverting input '+' of the single op-amp 102 from being less than 0V. For example, the AC input signal may be a 100V peak-to-peak signal and the DC voltage offset network 108 may reduce the peak-to-peak signal by 95% or more to 5V or less. The DC voltage offset network 108 may shift the AC input signal up or down.

In FIG. 1, the DC voltage offset network 108 includes a first resistor R1_off, a second resistor R2_off, and a third resistor R3_off. The first resistor R1_off is electrically coupled between a DC supply voltage 'VDDD' and a first node 110 of the DC offset network 108. The second resistor R2_off is electrically coupled between the first node 110 of the DC offset network 108 and the non-inverting input '+' of the single op-amp 102. The third resistor R3_off is electrically coupled between the first node 110 of the DC offset network 108 and ground. In one embodiment, the DC offset network 108 further includes a capacitor C1_off electrically coupled between the first node 110 of the DC offset network 108 and ground, to make the DC voltage offset DC only and to stabilize the DC voltage offset at the third resistor R3_off by providing an AC short to ground.

The following example is provided to illustrate the DC voltage offset feature. A DC offset of ~0.45V is applied using R2_off+R1_off‖R3_off and is set to allow AC_signal to reach 50V before the non-inverting input '+' of the single op-amp 102 drops below 0V. A resistor network comprising R_in +R_adc+R1_off‖R3_off has a division ratio of 0.023 V/V. The output capacitor C_out stores the peak voltage for reading, e.g., by an ADC. The RC network formed by R1‖C1/C2 creates a fast response and the AC gain of AC_signal=(VADC−0.45)/0.023 in this example. Capacitor C1_off of the DC voltage offset network 108 creates an AC ground which allows a pure DC shift of the AC input signal to occur. A resistor divider network comprising resistors R_in, R2_off, and R3_off down level shifts (i.e., reduces) the voltage level of the AC signal applied to the non-inverting input '+' of the signal op-amp 102, which allows a low voltage op-amp to be used as the single op-amp 102 for monitoring high voltage signals. The DC voltage offset network 108 creates a DC bias that keeps the AC input shifted above ground, so that the single op-amp 102 does not operate outside its supply rails VDDD, VSS.

Figure 2:
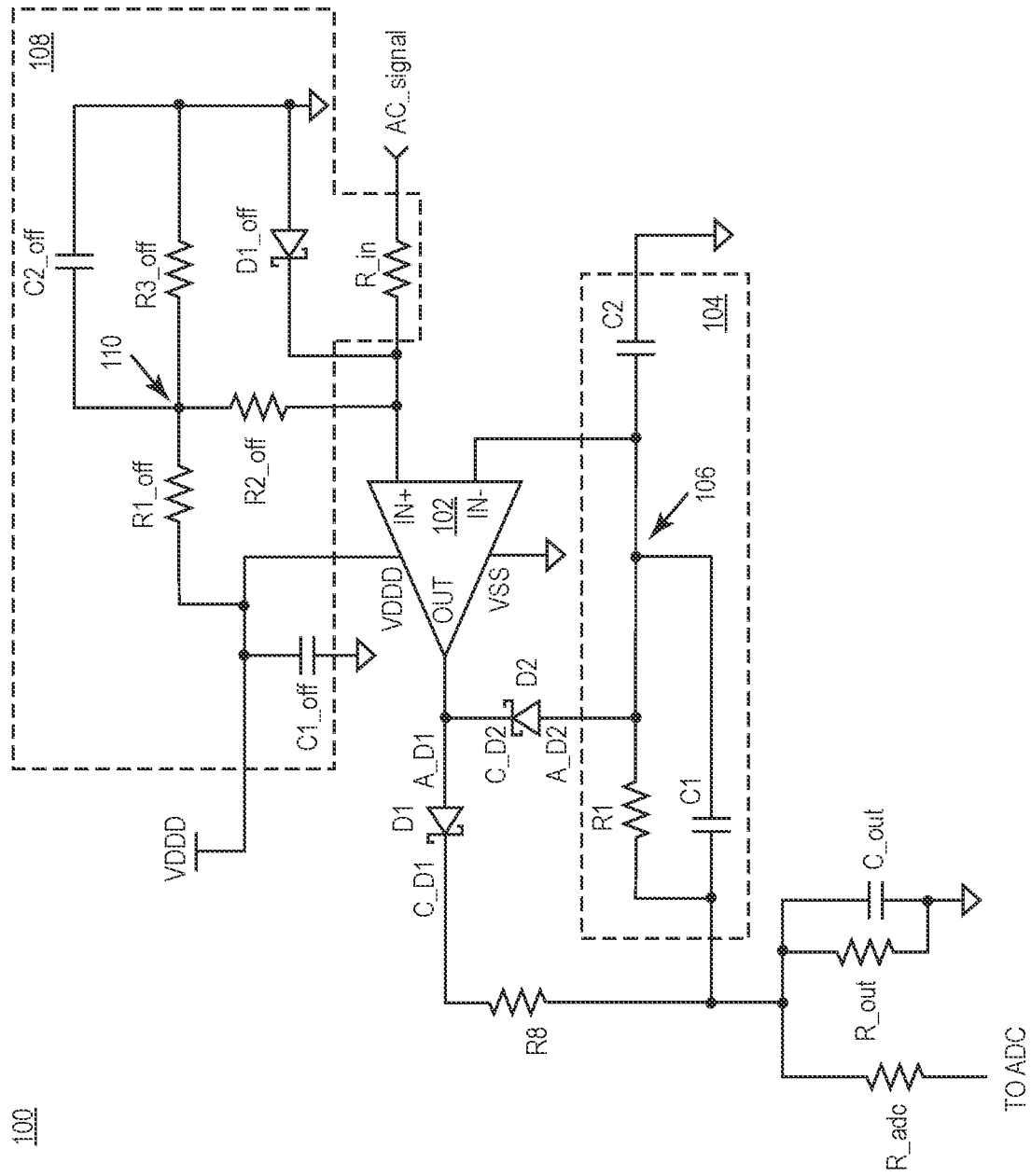
FIG. 2 illustrates a circuit schematic of the peak detector circuit, according to another embodiment.

FIG. 2 illustrates a circuit schematic of the peak detector circuit 100, according to another embodiment. In FIG. 2, the DC voltage offset network 108 includes an additional capacitor C2_off in parallel with the third resistor R3_off of the DC voltage offset network 108 and a diode D1_off connected between ground and the non-inverting input '+' of the signal op-amp 102. The additional capacitor C2_off acts as an AC short which makes the offset a pure DC bias without AC RMS voltage shifting effects, so the host controller can more accurately calculate the peak voltage of the AC signal. The diode D1_off prevents the non-inverting input '+' of the single op-amp 102 from becoming too negative and is an optional protection component. Also in FIG. 2, a resistor R_out is in parallel with the output capacitor C_out. The resistor R_out discharges the output capacitor C_out so that reductions in peak AC signal voltage are quickly realized and if the AC signal abruptly ends, the ADC will immediately be able to detect the end of the AC signal. This time constant should be at least 5× greater than the AC signal frequency. The peak detector circuit 100 illustrated in FIGS. 1 and 2 may be used in any type of system where peak detection is required.

Figure 3:
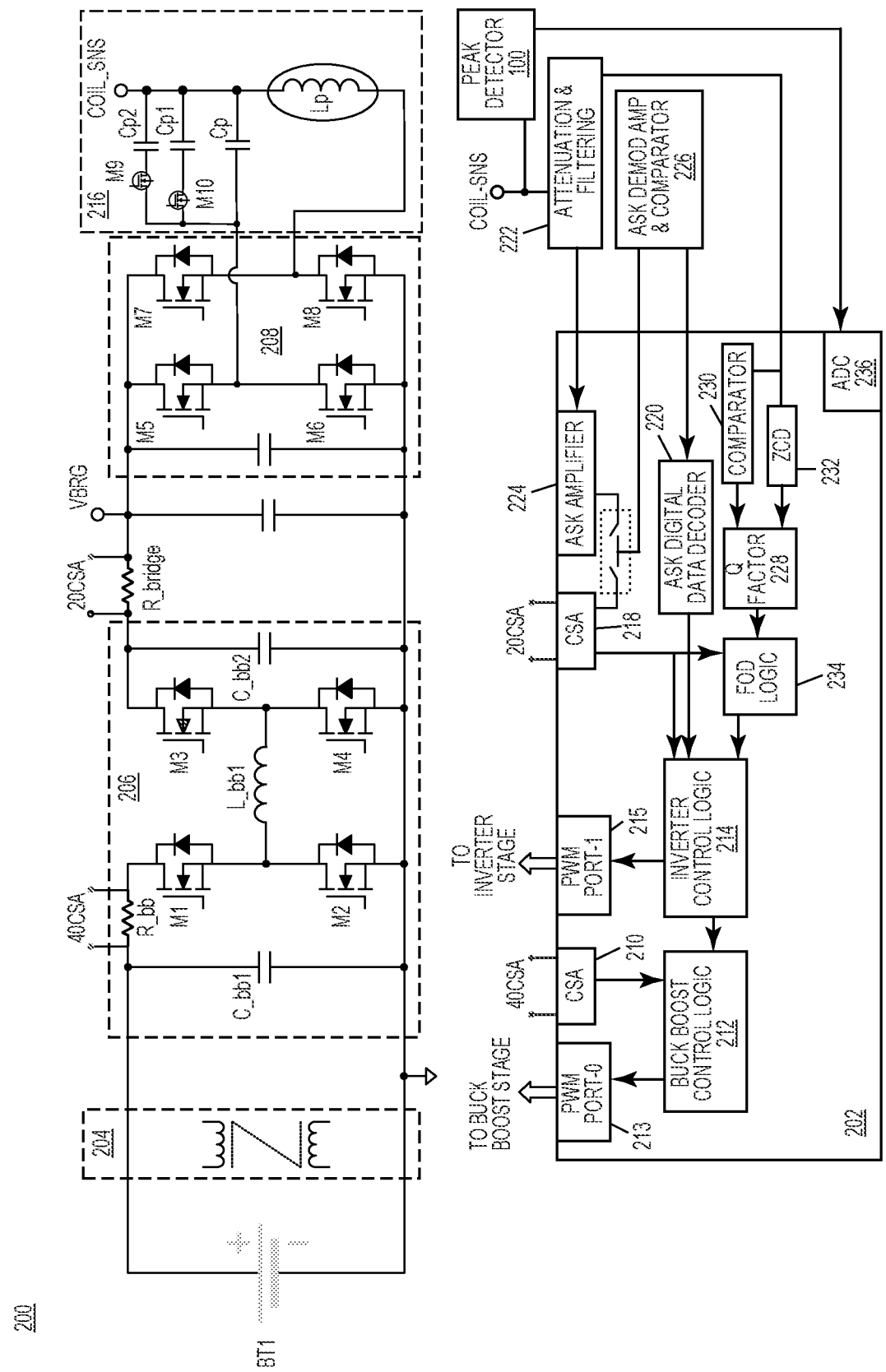
FIG. 3 illustrates a circuit schematic of an electronics system that includes the peak detector circuit, according to an embodiment.

FIG. 3 illustrates a circuit schematic of an electronics system 200 that includes the peak detector circuit 100, according to an embodiment. In FIG. 3, the electronics system 200 is a wireless power transfer system. Wireless power transfer functionality is used across many applications such as smartphones, wearable devices such as wireless headphones and smartwatches, power tools, small kitchen appliances, in-vehicle wireless charging, health accessories, etc. The electronics system 200 also includes a controller 202 and a power electronics circuit that may include an EMI (electromagnetic-interference) filter/choke 204, a buck-boost stage 206, an inverter stage 208, and a power transfer coil Lp.

A DC input 'BT1' to the electronics system 200 may be provided by a Type-C USB PD (power delivery) or DC input port, for example. In this case, the controller 202 is a USB Type-C PD controller. The EMI filter/choke 204 may be used after the Type-C connector, as shown in FIG. 3. The buck-boost stage 206 and the controller 202 form a buck-boost regulator that powers the inverter stage 208 at node VBRG to enable wireless power transfer, e.g., per the Qi interface standard for wireless power transfer using inductive charging.

The buck-boost stage 206 includes input and output bypass capacitors C_bb1, C_bb2, power transistors M1 through M4, and an inductor L_bb. The controller 202 provides current protection using a current sense amplifier (CSA) 210 connected across an input resistor R_bb of the buck-boost stage 206. The controller 202 also includes control logic and related circuitry 212 such as integrated high and low-side gate drivers and PWM (pulse width modulation) generation logic for output voltage control of the buck-boost stage 206, via a corresponding port 213 of the controller 202.

The controller 202 also includes an integrated inverter controller 214 for generating a bridge voltage used to power a full-bridge inverter of the inverter stage 208 formed by power transistors M5 through M8 and that powers a transmit (Tx) resonance tank 216 to deliver power to the receive (Rx) side via power transfer coil Lp. The receive side is not shown in FIG. 3.

The inverter stage 208 supports a wide input operating voltage range (e.g., 3V to 22V or higher) for power transfer. The integrated gate drivers 214 of the controller 202 control the full-bridge (or half-bridge) inverter stage 208, via a corresponding port 215 of the controller 202, and depending on the wireless power transfer specification type and operating scenario. The controller 202 protects the inverter stage 208 from over-current and short-circuit faults by monitoring the bridge current through resistor R_bridge and inspecting for over-current events using an additional CSA 218. The capacitance value of the transmit resonance tank 216 may be adjusted via switch devices M9, M10 that connect or disconnect additional capacitances Cp1, Cp2 in parallel with the main resonance capacitance Cp. In FIG. 3, the programmable resonance tank capacitance may be Cp, Cp∥Cp1, Cp∥Cp2, or Cp∥Cp1∥Cp2.

Communication from Tx to Rx may be by frequency shift key (FSK) modulation and from Rx to Tx by amplitude shift key (ASK) modulation. The communication from Rx to Tx is created by modulating the load on the Rx side, causing a reflection to appear on the Tx side which is filtered and decoded by the controller 202. To this end, the controller 202 may include a decoder 220 that detects voltage and current variations in the Tx coil signal caused by the Rx modulation signal. The voltage path for ASK may use an external band pass filter 222 to filter the demodulated signal out of the carrier wave. The current sense capability of the controller 202 uses the bridge current sense resistor R_bridge and an integrated differential amplifier 224 to sense the ASK variations. Both ASK sensing paths can be multiplexed to an op-amp filter and comparator circuitry 226, to improve communication in low signal-to-noise environments or conditions.

The controller 202 may include integrated Q factor detection logic 228, for providing Q factor and resonance frequency measurements for Q-FOD pre-power delivery. The measurements may be made using a comparator 230 and a zero-crossing detector (ZCD) 232. The measurement of the Q factor may be performed directly before every digital ping. For example, the number of cycle count between two coil voltages and the period between the corresponding rising edge pulses may be used for Q factor and resonance frequency measurement.

The controller 202 also may include integrated foreign object detection (FOD) logic 234 for supporting power loss FOD during power transfer. The FOD logic 234 uses the Tx power measured at the buck output and is the product of the bridge voltage and the bridge current. The controller 202 may include additional logic and/or circuit blocks such as interface logic/ports like I2C, UART, SWD (serial wire debug), etc., general purpose I/Os (inputs/outputs), linear drop out regulators, memory, etc.

The coil voltage 'COIL_SNS' of the power transfer coil Lp is the AC input signal to the peak detector circuit 100. The peak detector circuit 100 detects a peak voltage at the power transfer coil Lp, based on the coil voltage COIL_SNS. The controller 202 controls power transfer via the power transfer coil Lp based on the peak voltage detected by the peak detector circuit 100, as digitized by an analog-to-digital converter (ADC) 236 of the controller 202, by controlling the buck-boost stage 206 and the inverter stage 208. The controller 202 may use a CSA to detect peak current based on the peak voltage detected by the peak detector circuit 100 and digitized by the ADC 236.

The controller 202 may be configured to estimate current in the power transfer coil Lp. The power transfer coil current can be calculated as follows:

$$i_{coil} = C * \frac{dv_{COIL\_SNS\_PP}}{dt} \tag{1}$$

where $V_{COIL\_SNS\_PP}$ is the peak-to-peak voltage across the resonance capacitors Cp, Cp1, Cp2, dt is ½*fop (operating frequency) of the power inverter (half cycle or time for the voltage to change from the positive peak to the negative peak), and C is the value of the resonance capacitance (Cp ||Cp1||Cp2). The controller 202 can estimate the voltage $V_{COIL\_SNS\_PP}$ as follows:

$$V_{COIL\_SNS\_PP} = \left(\frac{V_{ADC} * 2}{K}\right) + VBRG \quad (2)$$

where $V_{ADC}$ is the peak-to-peak voltage detected by the peak detector circuit 100 and digitized by the ADC 236, K is a constant, and VBRG is the bridge voltage between the buck-boost stage 206 and the inverter stage 208. The constant K corresponds to the voltage divider ratio (R_in+ R_adc+R1_off||R3_off) formed by resistors R_in, R_adc, R1_off, and R3_off of the peak detector circuit 100.

Separately or in combination, the controller 202 may be configured to estimate a coupling factor of the wireless power transfer system. The coupling factor estimate can be calculated as follows:

$$Kmeas = \frac{Vping}{V_{ADC} + Vinv} \quad (3)$$

where Vping is the digital ping voltage reported by the Rx side, Vinv is the measured inverter voltage, and $V_{ADC}$ is the peak-to-peak voltage detected by the peak detector circuit 100 and digitized by the ADC 236.

Separately or in combination, the controller 202 may be configured to implement signal demodulation. Separately or in combination, the controller 202 may be configured to estimate a quality factor of the power transfer coil Lp based on the peak voltage detected by the peak detector circuit 100 and digitized by the ADC 236. The quality factor (QF) can be calculated as follows:

$$QF = \frac{\pi * N}{LN\left(\frac{V1}{V2}\right)} \quad (4)$$

Figure 4:
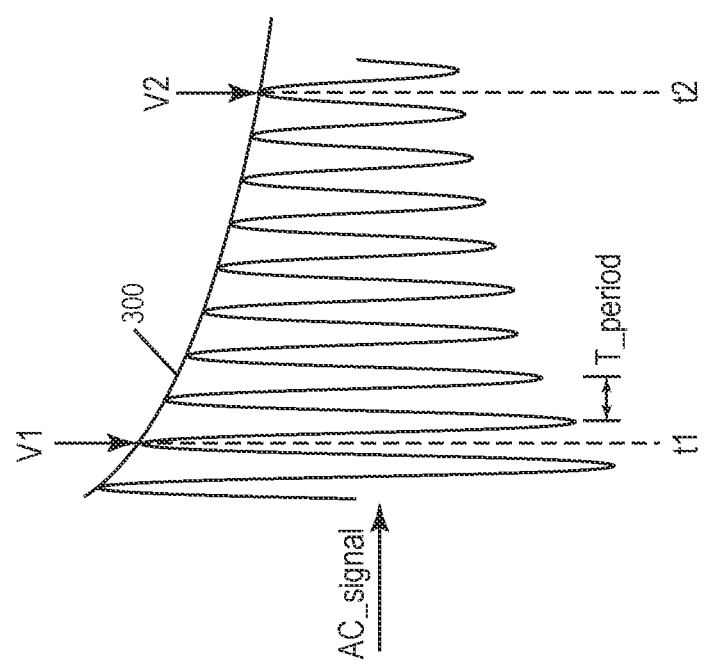
FIG. 4 illustrates a quality factor estimation technique implemented using the peak detector circuit.

The peak detector circuit 100 converts the periodic AC signal to the signal envelope waveform 300 shown in FIG. 4, where T_period is the period of the periodic AC signal and $$\frac{1}{T\_period}$$

is the resonance frequency. By measuring the voltages V1, V2 at a known time points t1, t2, the exponential decay of the voltage can be used to determine the quality factor QF. The controller 202 can use the time between the voltage readings V1 and V2 instead of π*N to estimate the quality factor QF.

In another embodiment, the electronics system 200 is a power supply system such as a switched mode power supply. In this embodiment, the peak detector circuit 100 is configured to detect a peak voltage at an output of the power supply system. The controller 202 is configured to regulate an output current and/or an output voltage of the power supply based on the peak voltage detected by the peak detector circuit 110 and as digitized by the ADC 236 of the controller 202.

Although the present disclosure is not so limited, the following numbered examples demonstrate one or more aspects of the disclosure.

Example 1. A peak detector circuit, comprising: a single operational amplifier having a non-inverting input, an inverting input, and an output; an output capacitor; a first diode having an anode electrically coupled to the output of the single operational amplifier and a cathode electrically coupled to the output capacitor; an RC feedback network electrically coupled between the output capacitor and the inverting input of the single operational amplifier; and a second diode having an anode electrically coupled to the inverting input of the single operational amplifier and a cathode electrically coupled to the anode of the first diode.

Example 2. The peak detector circuit of example 1, wherein the RC feedback network comprises: a first capacitor electrically coupled between the inverting input of the single operational amplifier and the output capacitor; a second capacitor electrically coupled between the inverting input of the single operational amplifier and ground; and a first resistor in parallel with the first capacitor.

Example 3. The peak detector circuit of example 2, wherein the anode of the second diode is electrically coupled to a node common to the first resistor, the first capacitor, and the second capacitor.

Example 4. The peak detector circuit of example 2 or 3, wherein a capacitance ratio of the first and second capacitors is in a range of 0.9 to 1.1.

Example 5. The peak detector circuit of any of examples 1 through 4, wherein the second diode is configured to accelerate forward biasing of the first diode via the RC feedback network when the second diode is in forward conduction.

Example 6. The peak detector circuit of any of examples 1 through 5, wherein a transfer function representing the RC feedback network has a zero located about 10 times away from a fastest operating frequency of the peak detector circuit.

Example 7. The peak detector circuit of any of examples 1 through 6, wherein the RC feedback network is configured to track the non-inverting input of the single operational amplifier and capture peak pulses at the output of the single operational amplifier when a voltage at the output capacitor is less than a voltage at the non-inverting input of the single operational amplifier.

Example 8. The peak detector circuit of any of examples 1 through 7, wherein the second diode is configured to provide a discharge path for the output capacitor when the second diode is in forward conduction.

Example 9. The peak detector circuit of any of examples 1 through 8, wherein the second diode is configured to rectify a signal at the anode of the second diode, and wherein the RC feedback network is configured to compensate for a voltage drop across the first diode.

Example 10. The peak detector circuit of example 1, further comprising: a DC voltage offset network electrically coupled to the non-inverting input of the single operational amplifier and configured to apply a DC voltage offset to the non-inverting input of the single operational amplifier.

Example 11. The peak detector circuit of example 10, wherein the DC voltage offset is selected such that an AC signal applied to the non-inverting input of the single operational amplifier has a peak-to-peak voltage of at least 50V before the non-inverting input of the single operational amplifier drops below 0V.

Example 12. The peak detector circuit of example 10 or 11, wherein the DC voltage offset is based on a magnitude of an AC signal input to the peak detector circuit, to prevent the non-inverting input of the single operational amplifier from being less than 0V.

Example 13. The peak detector circuit of any of examples 10 through 12, wherein the DC offset network comprises: a first resistor electrically coupled between a DC supply voltage and a first node of the DC offset network; a second resistor electrically coupled between the first node of the DC offset network and the non-inverting input of the single operational amplifier; and a third resistor electrically coupled between the first node of the DC offset network and ground.

Example 14. The peak detector circuit of example 13, wherein the DC offset network further comprises: a capacitor electrically coupled between the first node of the DC offset network and ground, to make the DC voltage offset DC only and to stabilize the DC voltage offset at the third resistor by providing an AC short to ground.

Example 15. The peak detector circuit of any of examples 1 through 14, further comprising: a resistor divider network configured to reduce a voltage level of an AC signal input to the non-inverting input of the single operational amplifier.

Example 16. An electronics system, comprising: a controller; and a peak detector circuit comprising: a single operational amplifier having a non-inverting input, an inverting input, and an output; an output capacitor; a first diode having an anode electrically coupled to the output of the single operational amplifier and a cathode electrically coupled to the output capacitor; an RC feedback network electrically coupled between the output capacitor and the inverting input of the single operational amplifier; and a second diode having an anode electrically coupled to the inverting input of the single operational amplifier and a cathode electrically coupled to the anode of the first diode, wherein the controller comprises an analog-to-digital converter configured to digitize a voltage at the output capacitor of the peak detector circuit, wherein the controller is configured to control one or more electronic components of the electronics system based on the voltage digitized by the analog-to-digital converter.

Example 17. The electronics system of example 16, wherein the electronics system is a wireless power transfer system, wherein the peak detector circuit is configured to detect a peak voltage at a power transfer coil of the wireless power transfer system, and wherein the controller is configured to control power transfer via the power transfer coil based on the peak voltage detected by the peak detector circuit and digitized by the analog-to-digital converter.

Example 18. The electronics system of example 17, wherein the controller is configured to one or more of: estimate current in the power transfer coil; estimate a coupling factor of the wireless power transfer system; implement signal demodulation; and estimate a quality factor of the power transfer coil based on the peak voltage detected by the peak detector circuit and digitized by the analog-to-digital converter.

Example 19. The electronics system of example 16, wherein the electronics system is a power supply, wherein the peak detector circuit is configured to detect a peak voltage at an output of the power supply, and wherein the controller is configured to regulate an output current and/or an output voltage of the power supply based on the peak voltage detected by the peak detector circuit and digitized by the analog-to-digital converter.

Example 20. The electronics system of any of examples 16 through 19, wherein the controller further comprises a current sense amplifier configured to detect peak current based on the peak voltage detected by the peak detector circuit and digitized by the analog-to-digital converter.

Example 21. The electronics system of any of examples 16 through 20, wherein the peak detector circuit further comprises a DC voltage offset network electrically coupled to the non-inverting input of the single operational amplifier and configured to apply a DC voltage offset to the non-inverting input of the single operational amplifier.

Example 22. The electronics system of any of examples 16 through 21, wherein the peak detector circuit further comprises a resistor divider network configured to reduce a voltage level of an AC signal input to the non-inverting input of the single operational amplifier.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A peak detector circuit, comprising:
  a single operational amplifier having a non-inverting input, an inverting input, and an output;
  an output capacitor;
  a first diode having an anode electrically coupled to the output of the single operational amplifier and a cathode electrically coupled to the output capacitor;
  an RC feedback network electrically coupled between the output capacitor and the inverting input of the single operational amplifier; and
  a second diode having an anode electrically coupled to the inverting input of the single operational amplifier and a cathode electrically coupled to the anode of the first diode.

2. The peak detector circuit of claim 1, wherein the RC feedback network comprises:
   a first capacitor electrically coupled between the inverting input of the single operational amplifier and the output capacitor;
   a second capacitor electrically coupled between the inverting input of the single operational amplifier and ground; and
   a first resistor in parallel with the first capacitor.

3. The peak detector circuit of claim 2, wherein the anode of the second diode is electrically coupled to a node common to the first resistor, the first capacitor, and the second capacitor.

4. The peak detector circuit of claim 2, wherein a capacitance ratio of the first and second capacitors is in a range of 0.9 to 1.1.

5. The peak detector circuit of claim 1, wherein the second diode is configured to accelerate forward biasing of the first diode via the RC feedback network when the second diode is in forward conduction.

6. The peak detector circuit of claim 1, wherein a transfer function representing the RC feedback network has a zero located about 10 times away from a fastest operating frequency of the peak detector circuit.

7. The peak detector circuit of claim 1, wherein the RC feedback network is configured to track the non-inverting input of the single operational amplifier and capture peak pulses at the output of the single operational amplifier when a voltage at the output capacitor is less than a voltage at the non-inverting input of the single operational amplifier.

8. The peak detector circuit of claim 1, wherein the second diode is configured to provide a discharge path for the output capacitor when the second diode is in forward conduction.

9. The peak detector circuit of claim 1, wherein the second diode is configured to rectify a signal at the anode of the second diode, and wherein the RC feedback network is configured to compensate for a voltage drop across the first diode.

10. The peak detector circuit of claim 1, further comprising:
    a DC voltage offset network electrically coupled to the non-inverting input of the single operational amplifier and configured to apply a DC voltage offset to the non-inverting input of the single operational amplifier.

11. The peak detector circuit of claim 10, wherein the DC voltage offset is selected such that an AC signal applied to the non-inverting input of the single operational amplifier has a peak-to-peak voltage of at least 50V before the non-inverting input of the single operational amplifier drops below 0V.

12. The peak detector circuit of claim 10, wherein the DC voltage offset is based on a magnitude of an AC signal input to the peak detector circuit, to prevent the non-inverting input of the single operational amplifier from being less than 0V.

13. The peak detector circuit of claim 10, wherein the DC offset network comprises:
    a first resistor electrically coupled between a DC supply voltage and a first node of the DC offset network;
    a second resistor electrically coupled between the first node of the DC offset network and the non-inverting input of the single operational amplifier; and
    a third resistor electrically coupled between the first node of the DC offset network and ground.

14. The peak detector circuit of claim 13, wherein the DC offset network further comprises:
    a capacitor electrically coupled between the first node of the DC offset network and ground, to make the DC voltage offset DC only and to stabilize the DC voltage offset at the third resistor by providing an AC short to ground.

15. The peak detector circuit of claim 1, further comprising:
    a resistor divider network configured to reduce a voltage level of an AC signal input to the non-inverting input of the single operational amplifier.

16. An electronics system, comprising:
    a controller; and
    a peak detector circuit comprising:
       a single operational amplifier having a non-inverting input, an inverting input, and an output;
       an output capacitor;
       a first diode having an anode electrically coupled to the output of the single operational amplifier and a cathode electrically coupled to the output capacitor;
       an RC feedback network electrically coupled between the output capacitor and the inverting input of the single operational amplifier; and
       a second diode having an anode electrically coupled to the inverting input of the single operational amplifier and a cathode electrically coupled to the anode of the first diode,
    wherein the controller comprises an analog-to-digital converter configured to digitize a voltage at the output capacitor of the peak detector circuit,
    wherein the controller is configured to control one or more electronic components of the electronics system based on the voltage digitized by the analog-to-digital converter.

17. The electronics system of claim 16, wherein the electronics system is a wireless power transfer system, wherein the peak detector circuit is configured to detect a peak voltage at a power transfer coil of the wireless power transfer system, and wherein the controller is configured to control power transfer via the power transfer coil based on the peak voltage detected by the peak detector circuit and digitized by the analog-to-digital converter.

18. The electronics system of claim 17, wherein the controller is configured to one or more of:
    estimate current in the power transfer coil;
    estimate a coupling factor of the wireless power transfer system;
    implement signal demodulation; and
    estimate a quality factor of the power transfer coil based on the peak voltage detected by the peak detector circuit and digitized by the analog-to-digital converter.

19. The electronics system of claim 16, wherein the electronics system is a power supply, wherein the peak detector circuit is configured to detect a peak voltage at an output of the power supply, and wherein the controller is configured to regulate an output current and/or an output voltage of the power supply based on the peak voltage detected by the peak detector circuit and digitized by the analog-to-digital converter.

20. The electronics system of claim 16, wherein the controller further comprises a current sense amplifier configured to detect peak current based on the peak voltage detected by the peak detector circuit and digitized by the analog-to-digital converter.

21. The electronics system of claim 16, wherein the peak detector circuit further comprises a DC voltage offset network electrically coupled to the non-inverting input of the single operational amplifier and configured to apply a DC voltage offset to the non-inverting input of the single operational amplifier.

22. The electronics system of claim 16, wherein the peak detector circuit further comprises a resistor divider network configured to reduce a voltage level of an AC signal input to the non-inverting input of the single operational amplifier.

* * * * *